(12) United States Patent
Rhee et al.

(10) Patent No.: US 7,986,095 B2
(45) Date of Patent: Jul. 26, 2011

(54) ORGANIC LIGHT EMITTING DIODE WITH ENHANCED LUMINANCE AND LIGHT UNIFORMITY

(75) Inventors: Jung-Soo Rhee, Seoul (KR); Beohm-Rock Choi, Seoul (KR); Joon-Chul Goh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 790 days.

(21) Appl. No.: 11/510,802

(22) Filed: Aug. 25, 2006

(65) Prior Publication Data

US 2007/0046193 A1 Mar. 1, 2007

(30) Foreign Application Priority Data

Aug. 26, 2005 (KR) .................. 10-2005-0078624

(51) Int. Cl.
*H01J 1/62* (2006.01)
(52) U.S. Cl. ........................................... 313/509
(58) Field of Classification Search ............. 313/503, 313/504, 506, 509
See application file for complete search history.

(56) References Cited

U.S. PATENT DOCUMENTS

| | | | | |
|---|---|---|---|---|
| 6,475,845 B2 * | 11/2002 | Kimura | ........................ | 438/200 |
| 2002/0024298 A1 * | 2/2002 | Fukunaga | .................... | 313/506 |
| 2002/0036462 A1 * | 3/2002 | Hirano | ......................... | 313/506 |
| 2003/0085654 A1 * | 5/2003 | Hayashi | ....................... | 313/506 |
| 2003/0214231 A1 * | 11/2003 | Hishida | ........................ | 313/506 |
| 2004/0087252 A1 | 5/2004 | Huang | | |
| 2004/0108810 A1 * | 6/2004 | Tsujimura et al. | ............ | 313/506 |
| 2004/0135173 A1 * | 7/2004 | Choi et al. | ..................... | 257/200 |
| 2004/0191566 A1 * | 9/2004 | Kikuchi et al. | ............... | 428/690 |
| 2004/0201021 A1 * | 10/2004 | Hirata | .............................. | 257/72 |
| 2009/0072730 A1 * | 3/2009 | Choi et al. | ..................... | 313/504 |

FOREIGN PATENT DOCUMENTS

| | | |
|---|---|---|
| JP | 2001-056650 | 2/2001 |
| JP | 2003-144261 | 5/2003 |
| JP | 2003-308971 | 10/2003 |
| JP | 2004-170915 | 6/2004 |
| JP | 2004-296211 | 10/2004 |
| JP | 2004-303644 | 10/2004 |
| KR | 1020010112623 | 12/2001 |
| KR | 10-0437769 | 6/2004 |
| KR | 1020040106806 | 12/2004 |
| KR | 10-0484591 | 4/2005 |

* cited by examiner

*Primary Examiner* — Peter Macchiarolo
(74) *Attorney, Agent, or Firm* — Innovation Counsel LLP

(57) ABSTRACT

An organic light emitting diode display with enhanced luminance and light uniformity is presented, along with a method of manufacturing the display. The display including: a substrate, a first signal line formed on the substrate and a second signal line extending perpendicularly to the first signal line, and thin film transistors formed on the substrate and electrically coupled to the first signal line and the second signal line. A planarization member is formed on the same layer as the first signal line and/or the second signal line, such that it does not overlap the first signal line, the second signal line, and the thin film transistors. An insulating layer is formed on the first signal line, the second signal line, the thin film transistors, and the planarization member. Two electrodes are formed on the insulating layer connected to one of the thin film transistors and sandwiching a light emitting member.

13 Claims, 23 Drawing Sheets

ORGANIC LIGHT EMITTING DIODE WITH ENHANCED LUMINANCE AND LIGHT UNIFORMITY

CROSS-REFERENCE TO RELATED APPLICATION

This application claims priority from and the benefit of Korean Patent Application No. 10-2005-0078624 filed in the Korean Intellectual Property Office on Aug. 26, 2005, the entire content of which is incorporated herein by reference.

BACKGROUND OF THE INVENTION (a) Field of the Invention

The present invention relates to an organic light emitting diode (OLED) display and a manufacturing method thereof.

(b) Description of the Related Art

Recently, the trend for many display applications has been to become thinner and lighter without shrinking the size of the display area. Flat panel displays, which offer characteristics in line with this general trend, are therefore becoming increasingly popular as substitutes for conventional cathode ray tubes (CRT).

Flat panel displays include liquid crystal display (LCD), field emission display (FED), organic light emitting diode (OLED) display, and plasma display panel (PDP), among others. Among the flat panel displays, the OLED display, in many ways, has the most promising future because of its low power consumption, fast response time, wide viewing angle, and high contrast ratio.

An OLED display is a self-emissive display device that includes two electrodes and an organic light emitting layer interposed therebetween. One of the two electrodes injects holes and the other of the two electrodes injects electrons into the light emitting layer. The injected electrons and holes are combined to form excitons, and the excitons emit light as discharge energy upon changing its energy state.

The OLED displays may be divided into passive matrix OLED displays and active matrix OLED displays according to the driving method.

The passive matrix type OLED display includes a plurality of anode lines, a plurality of cathode lines extending perpendicularly to the anode lines, and a plurality of pixels. Each of the pixels includes a light emission layer, and the selection of one of the anode lines and one of the cathode lines causes light emission of the pixel located near where the selected signal overlap. In the active matrix type OLED display, each of a plurality of pixels includes a switching transistor, a driving transistor, and a storage capacitor, as well as an anode, a cathode, and a light emission layer. The driving transistor receives a data voltage from the switching transistor and drives a current having a magnitude that depends on the data voltage. The current from the driving transistor enters the light emission layer, causing emission of a light whose intensity depends on the current.

OLEDs are classified into a bottom-emission type and a top-emission type depending on the light emitting direction. In the bottom-emission type OLED, the primary light-exit surface is located at the bottom of a substrate provided with a thin film transistor. In contrast, the primary light-exit surface is located at the top of the device in the top-emission type OLED.

In the bottom-emission type OLED, light does not transmit through the area that has a thin film transistor and the signal lines, such as wiring. In the top-emission type OLED, on the other hand, the size of the light emission area does not depend on whether the area has the thin film transistor and the wiring. Accordingly, the aperture ratio of the top-emission type may be greater than the aperture ratio of the bottom-emission type.

However, in the top-emission type OLED, there may be a height difference between the regions having the TFTs and the wiring and the other regions, creating a non-uniform thickness in the light emitting layer. This non-uniformity is especially pronounced when the light emitting layer is made of soluble materials.

SUMMARY OF THE INVENTION

The present invention has been made in an effort to provide an OLED display and a manufacturing method thereof having a uniform light emission layer.

In one aspect, the invention is an organic light emitting diode display that includes: a substrate; a first signal line formed on the substrate; a second signal line extending substantially perpendicularly to the first signal line; a plurality of thin film transistors, a planarization member, an insulating layer, a first electrode, a light emitting member, and a second electrode. The thin film transistors are formed on the substrate and electrically coupled to the first signal line and the second signal line directly or indirectly. The planarization member is formed on the same layer as the first signal line and/or the second signal line, electrically separated from the first signal line, the second signal line, and the thin film transistors, and positioned to not overlap the first signal line, the second signal line, and the thin film transistors. The insulating layer is formed on the first signal line, the second signal line, the thin film transistors, and the planarization member. The first electrode is formed on the insulating layer and connected to one of the thin film transistors. The light emitting member is formed on the first electrode; and the second electrode is formed on the light emitting member.

The first electrode may include an opaque conductor.

The second electrode may include a transparent conductor or an translucent conductor.

The organic light emitting diode display may further include a subsidiary electrode line formed on the same layer as the first signal line or the second signal line and connected to the second electrode.

The surface of the insulating layer may have a uniform height.

The insulating layer may include an organic layer and an inorganic layer.

The planarization member may have a linear shape or a plate shape.

The light emitting member may include a soluble material.

The organic light emitting diode display may further include a partition surrounding the light emitting member.

The organic light emitting diode display may further include a sealing member formed on the second electrode, and the sealing member may include an insulating plate and a blocking member disposed between the insulating plate and the second electrode.

The blocking member may include a first blocking member and a second blocking member, and the first blocking member and the second blocking member may include at least one of thermosetting materials and photo-curable materials.

The blocking member may include a moisture absorbent.

In yet another aspect, the invention is a method of manufacturing an organic light emitting diode display. The method includes: forming a signal line, a thin film transistor, and a planarization member on a substrate; forming a passivation layer on the signal lines, the thin film transistors, and the planarization member; planarizing the passivation layer; and forming an organic light emitting diode on the passivation layer.

The planarization may be performed by at least one of chemical mechanical polishing, etch back, and thermal reflow.

The forming the passivation layer may include forming an organic layer and forming an inorganic layer.

The forming the plurality of signal lines, the plurality of thin film transistors, and the planarization member may include forming a gate pattern including a second control electrode and a gate line including a first control electrode on the substrate, forming a gate insulating layer on the gate pattern, forming a semiconductor pattern including first and second semiconductors on the gate insulating layer, and forming a data pattern including a data line having a first input electrode at least partially overlapping the first semiconductor and a driving voltage line having a second input electrode at least partially overlapping the second semiconductor, and a planarization member electrically isolated from the data line, the data line, and the second control electrode is formed in concurrence with at least one of the forming the gate pattern and the forming the data pattern.

The forming the organic light emitting diode may include forming a first electrode, forming a light emitting member on the first electrode, and forming a second electrode on the light emitting member.

The method may further include forming partition defining regions of the light emitting member after forming the first electrode.

The forming the light emitting member may be performed by a solution process.

The forming the light emitting member may be performed by inkjet printing.

The method may further include forming a sealing member after the forming a light emitting member, and the forming the sealing member may include forming a first blocking member on the light emitting member, hardening the first blocking member, forming a second blocking member on an insulating plate, adhering the insulating plate having the second blocking member on the first blocking member, and hardening the second blocking member.

The method may further include forming a sealing member after the forming a light emitting member, and the forming the sealing member may include forming a first blocking member on the light emitting member, hardening the first blocking member, forming a second blocking member on the hardened first blocking member, covering the second blocking member with an insulating plate in a first pressure condition, and hardening the first and second blocking members in a second pressure condition.

DETAILED DESCRIPTION OF THE EMBODIMENTS

Figure 1:
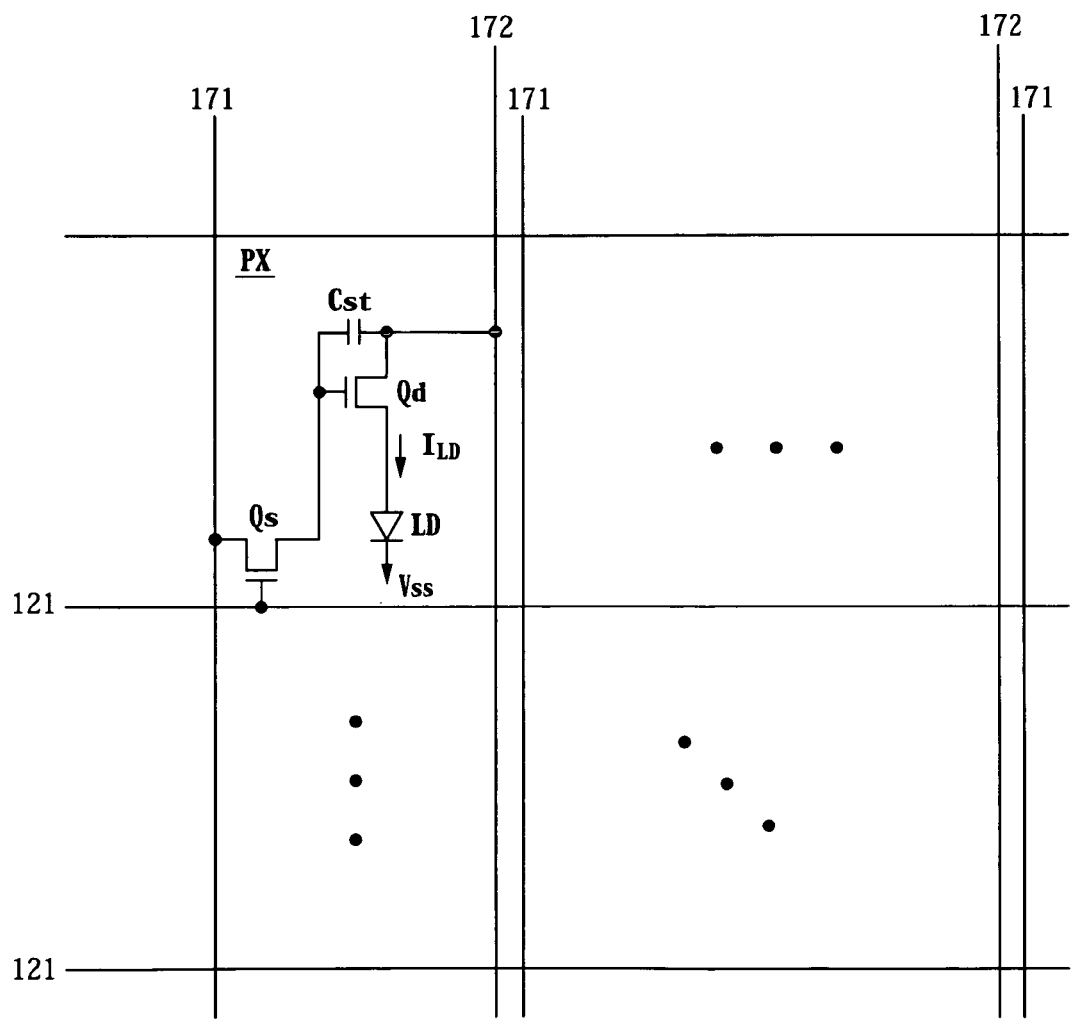
FIG. 1 is an equivalent circuit diagram of an OLED display according to an embodiment of the present invention.

The present invention will now be described more fully hereinafter with reference to the accompanying drawings, in which preferred embodiments of the invention are shown. As those skilled in the art would realize, the described embodiments may be modified in various different ways, all without departing from the spirit or scope of the present invention.

In the drawings, the thickness of layers, films, panels, regions, etc. are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" or "directly connected to" another element, there are no intervening elements present.

First, an OLED display according to an embodiment of the present invention is described in detail with reference to FIG. 1.

FIG. 1 is an equivalent circuit diagram of an OLED display according to an embodiment of the present invention.

Referring to FIG. 1, an OLED display according to an embodiment of the present invention includes a plurality of signal lines 121, 171, and 172 arranged to form a matrix and a plurality of pixels PX connected to the signal lines 121, 171, 172.

The signal lines include a plurality of gate lines 121 transmitting gate signals (or scanning signals), a plurality of data lines 171 transmitting data signals, and a plurality of driving signal lines 172 transmitting a driving voltage. The gate lines 121 extend substantially in a first direction and are arranged substantially parallel to each other, while the data lines 171 and the driving signal lines 172 extend substantially in a second direction and are arranged substantially parallel to each other. The first direction and the second direction are substantially perpendicular to each other.

Each pixel PX includes a switching transistor Qs, a driving transistor Qd, a storage capacitor Cst, and an organic light emitting diode LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to the gate signal applied to the gate line 121.

The driving transistor Qd has a control terminal connected to the switching transistor Qs, an input terminal connected to the driving signal line 172, and an output terminal connected to the OLED LD. The driving transistor Qd drives an output current $I_{LD}$ having a magnitude that depends on the voltage between the control terminal and the output terminal thereof.

The capacitor Cst is connected between the control terminal and the output terminal of the driving transistor Qd. The capacitor Cst stores the data signal applied to the control terminal of the driving transistor Qd and maintains the data signal after the switching transistor Qd turns off.

The OLED LD has an anode connected to the output terminal of the driving transistor Qd and a cathode connected to a common voltage Vss. The OLED LD emits light having an intensity that depends on an output current $I_{LD}$ of the driving transistor Qd, thereby displaying the desired images.

The switching transistor Qs and the driving transistor Qd are n-channel field effect transistors (FETs). However, at least one of the switching transistor Qs and the driving transistor Qd may be a p-channel FET. In addition, the connections among the transistors Qs and Qd, the capacitor Cst, and the OLED LD may be modified.

Figure 2:
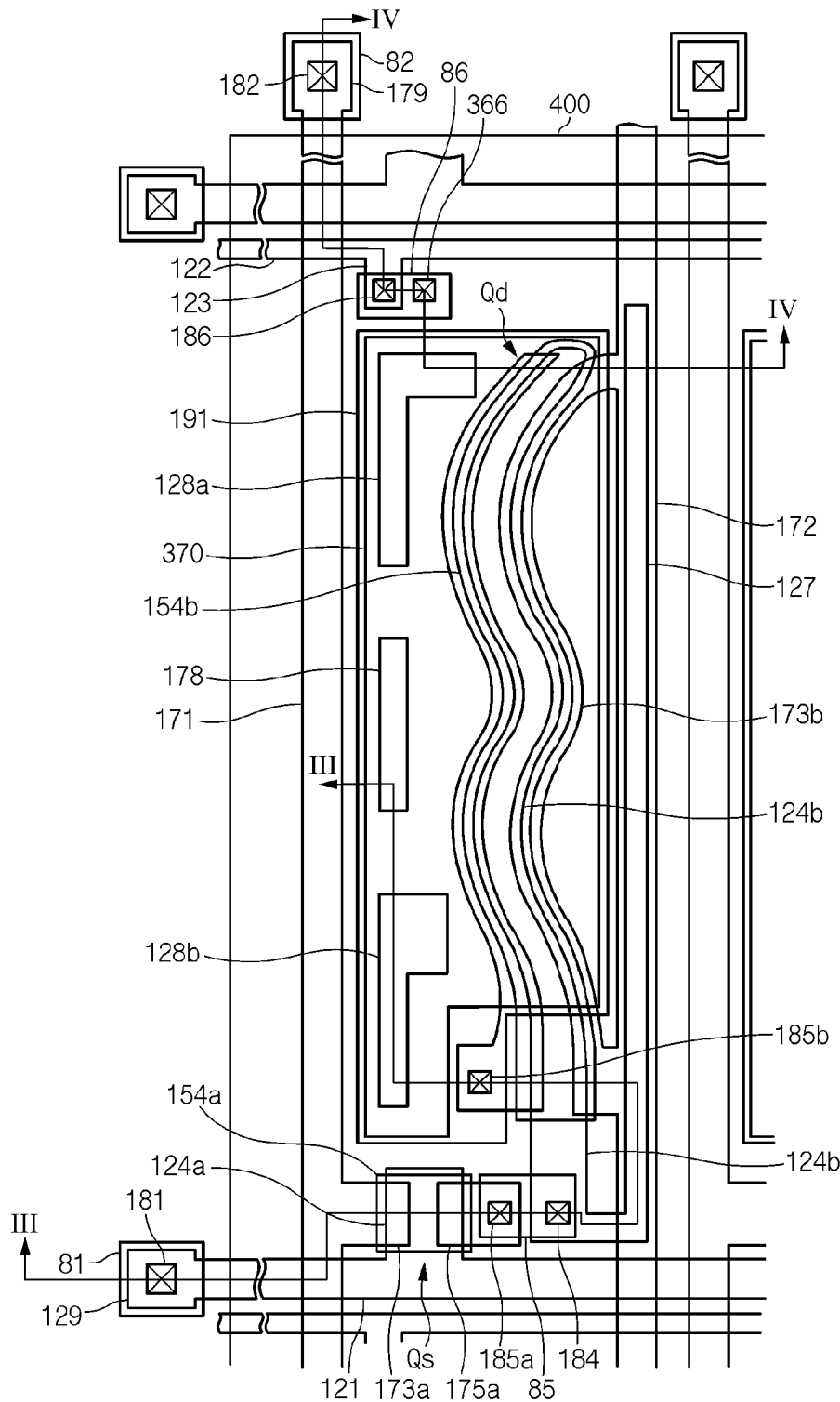
FIG. 2 is a layout view of an OLED display according to an embodiment of the present invention.
Figure 3:
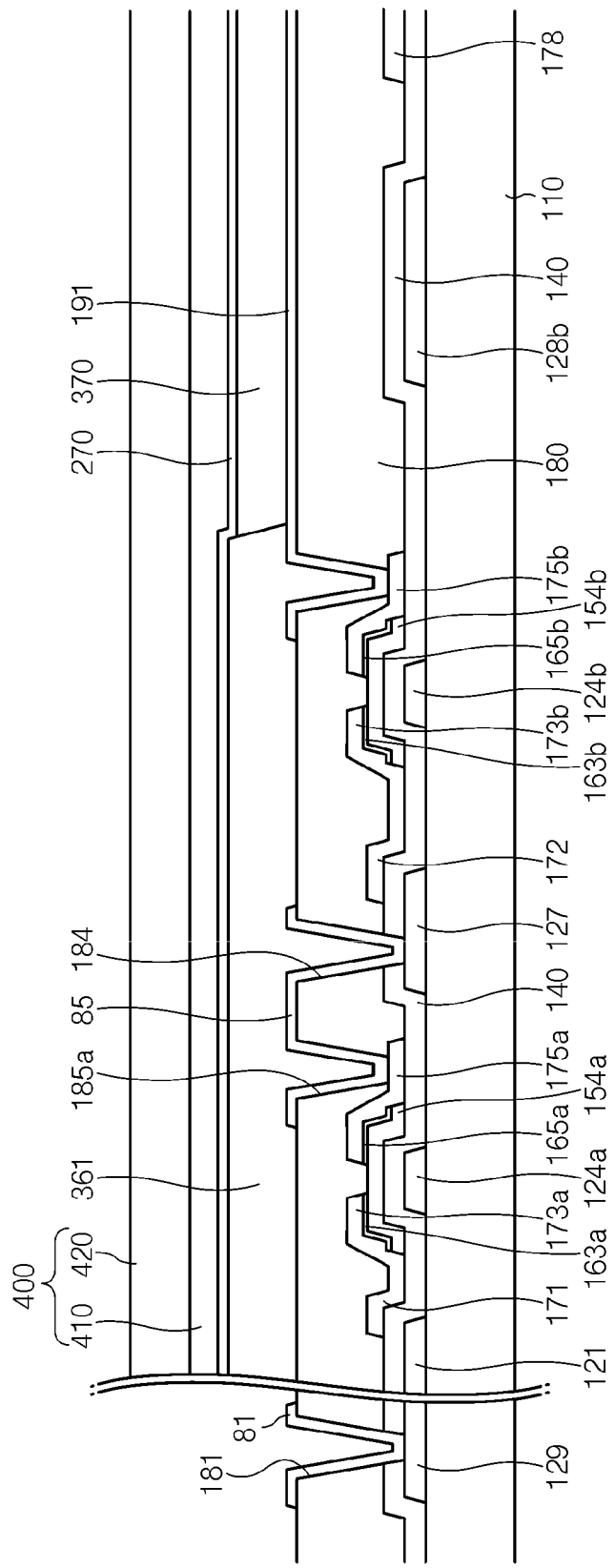
FIGS. 3 and 4 are sectional views of the OLED display shown in FIG. 2 taken along the lines III-III and IV-IV, respectively.
Figure 4:
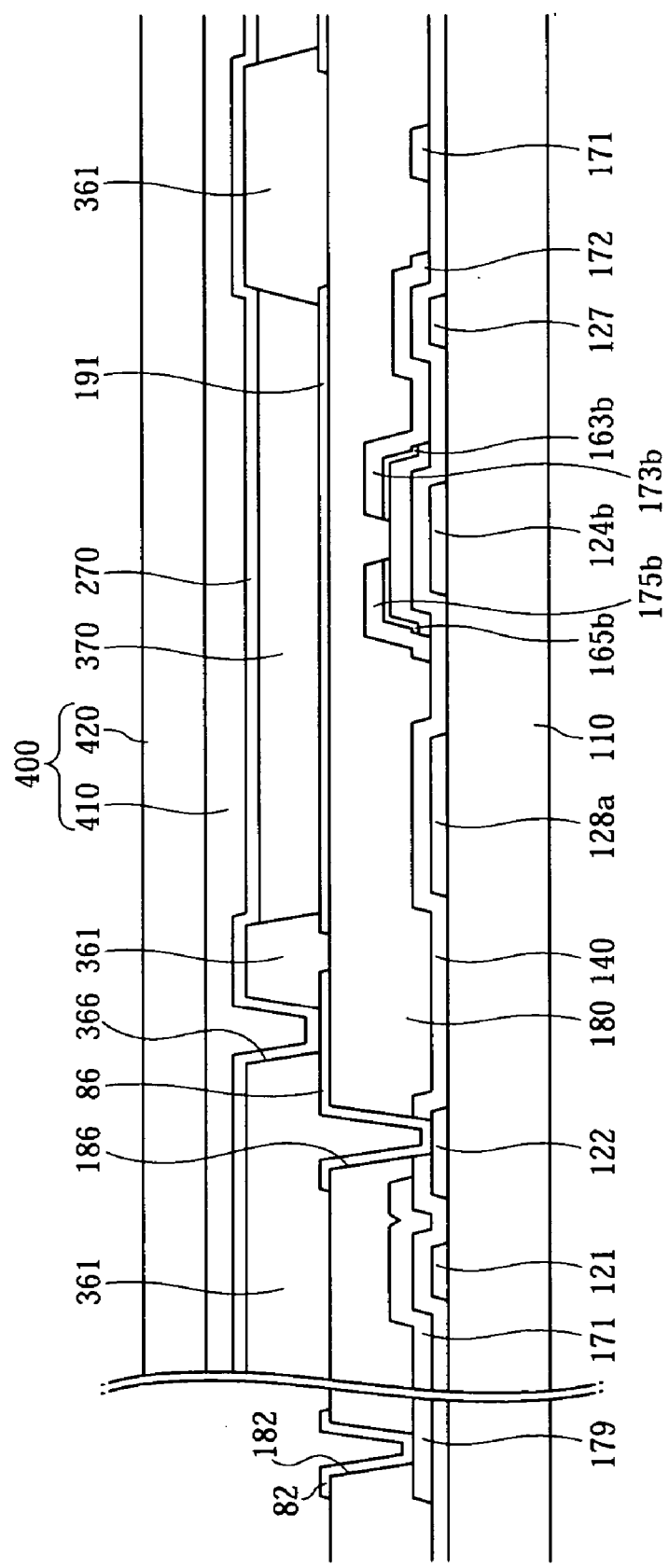

Referring to FIGS. 2-4, a detailed structure of the OLED display shown in FIG. 1 according to an embodiment of the present invention will be described in detail.

FIG. 2 is a layout view of an OLED display according to an embodiment of the present invention and FIGS. 3 and 4 are sectional views of the OLED display shown in FIG. 2 taken along the lines III-III and IV-IV, respectively.

A plurality of gate conductors, which include a plurality of gate lines 121 including first control electrodes 124a, a plurality of secondary electrode lines 122 including projections 123, a plurality of second control electrodes 124b, and a plurality of lower planarization members 128a and 128b, are formed on an insulating substrate 110. The insulating substrate 110 may be made of, for example a transparent glass or plastic.

The gate lines 121 for transmitting gate signals extend substantially in the first direction. Each gate line 121 further includes an end portion 129 having a large area for contact with another layer or an external driving circuit, and the first control electrodes 124a project upward from the gate line 121. The gate lines 121 may extend to be directly connected to a gate driving circuit (not shown) for generating the gate signals. Depending on the embodiment, the gate driving circuit may be integrated on the substrate 110.

Each of the second control electrodes 124b is separated from the gate lines 121 and has a wave-like shape that extends across the substrate 110. Each second control electrode 124b includes a storage electrode 127 extending from the second control electrode 124b.

Each of the secondary electrode lines 122 transmits a common voltage and extends substantially parallel to the gate lines 121. Each of the secondary electrode lines 122 includes a plurality of projections 123.

The lower planarization members 128a and 128b are separated from the gate lines 121, the second control electrodes 124b, and the secondary electrode lines 122, and may have any suitable shape, such as a linear shape or a plate shape.

Gate conductors, including the gate lines 121, the second control electrodes 124b, the secondary electrode lines 122, and the lower planarization members 128a, 128b are preferably made of an Al-containing metal such as Al and Al alloy, a Ag-containing metal such as Ag and Ag alloy, a Cu-containing metal such as Cu and Cu alloy, a Mo-containing metal such as Mo and Mo alloy, Cr, Ta, Ti, etc. Some of the gate conductors, like the gate lines 121 and the second control electrodes 124b, may have a multi-layered structure including two films having different physical characteristics.

The lateral sides of the gate conductors (e.g., the gate lines 121 and the second control electrodes 124b) are inclined relative to a surface of the substrate 110 to form inclination angles in the range of about 30-80 degrees.

A gate insulating layer 140, which is preferably made of silicon nitride (SiNx) or silicon oxide (SiOx), is formed on the gate lines 121 and the second control electrodes 124b.

A plurality of first and second semiconductor islands 154a and 154b, which are preferably made of hydrogenated amorphous silicon (abbreviated to "a-Si") or polysilicon, are formed on the gate insulating layer 140. The first and second semiconductor islands 154a and 154b are disposed on the first and second control electrodes 124a and 124b, respectively. The second semiconductor islands 154b have a wave-like shape similar to that of the second control electrodes 124b.

Multiple pairs of first ohmic contact islands 163a and 165a and multiple pairs of second ohmic contact islands 163b and 165b are formed on the first and second semiconductor islands 154a and 154b, respectively. The ohmic contacts 163a, 163b, 165a, and 165b are preferably made of silicide or n+ hydrogenated a-Si heavily doped with an n-type impurity such as phosphorous.

A plurality of data conductors, which include data lines 171, driving signal lines 172, first and second output electrodes 175a and 175b, and upper planarization members 178, are formed on the ohmic contacts 163a, 163b, 165b, and 165b and the gate insulating layer 140.

The data lines 171 for transmitting data signals extend substantially in the second direction perpendicularly to the gate lines 121. Each data line 171 includes a plurality of first input electrodes 173a extending toward the first control electrodes 124a and an end portion 179. The end portion 179 has a large area for contact with another layer or an external driving circuit. The data lines 171 may extend to be directly connected to a data driving circuit (not shown) for generating the data signals. Depending on the embodiment, the data driving circuit may be integrated on the substrate 110.

The driving signal lines 172 for transmitting driving voltages extend substantially in the second direction perpendicularly to the gate lines 121. Each driving signal line 172 includes a plurality of second input electrodes 173b extending toward the second control electrodes 124b. The driving signal lines 172 overlap the storage electrodes 127.

The first and second output electrodes 175a and 175b are separated from each other and from the data lines 171 and the driving signal lines 172. Each pair of the first input electrodes 173a and the first output electrodes 175a are disposed across a first control electrode 124a from each other, and each pair of the second input electrodes 173b and the second output electrodes 175b are disposed across a second control electrode 124b from each other. The second input electrode 173b and the second output electrode 175b have a wave-like shape similar to that of the second control electrode 124b.

The upper planarization members 178 are separated from the data line 171, the driving signal line 172, and the first and second output electrodes 175a and 175b, and may have any suitable shape such as a linear shape or a plate shape. The upper and lower planarization members 178, 128a, and 128b are disposed on regions where there is no gate line 121, data line 171, and etc, and therefore they do not overlap the gate lines 121, the data lines 171, the switching transistors Qs, or the driving transistors Qd. The upper planarization member 178 and the lower planarization members 128a and 128b may be arranged in an alternating manner or parallel to each other, and one thereof may be omitted.

Instead of the secondary electrode lines 122, other secondary electrode lines (not shown) may be formed together with the data conductors 171, 172, 175a, 175b, and 178. In this case, the secondary electrode lines may extend substantially parallel to the data line 171.

The data conductors 171, 172, 175a, 175b, and 178 are preferably made of any refractory metal including Mo, Cr, Ta, Ti, or alloys thereof. They may have a multilayered structure preferably including a refractory metal film and a low resistivity film.

Like the gate conductors (gate line 121, second control electrode 124b, secondary electrode line 122, lower planarization members 128a and 128b), the data conductors (data line 171, data signal line 172, first and second output electrodes 175a, 175b, and upper planarization member 178) have inclined edge profiles such that their sidewalls form inclination angles in the range of about 30-80 degrees with the substrate 110.

A passivation layer 180 is formed on the data conductors (171, 172, 175a, 175b, and 178), the exposed portions of the semiconductors 154a and 154b, and the gate insulating layer 140. The passivation layer 180 is preferably made of an inorganic insulator such as silicon nitride and silicon oxide or an organic insulator such as a polyacrylic compound. The passivation layer 180 may include a lower film made of an inorganic insulator and an upper film made of an organic insulator. The passivation layer 180 has a flat surface that may be obtained by any of various methods such as chemical mechanical polishing, etch back, and thermal reflow.

Meanwhile, the lower and upper planarization members 128a, 128b, and 178 may prevent the passivation layer 180 from losing its flatness over time due to the height difference of underlying layers. In more detail, the lower and upper planarization members 128a, 128b, and 178 are disposed on regions where there is no gate line 121, data line 171, switching transistor Qs, or driving transistor Qd as described above. This way, the passivation layer 180 is formed on a relatively flat surface, making it easier for the passivation layer 180 to maintain its shape.

The passivation layer 180 has a plurality of contact holes 182, 185a, and 185b exposing the end portions 179 of the data lines 171, the first output electrodes 175a, and the second output electrodes 175b, respectively. In addition, the passivation layer 180 and the gate insulating layer 140 have a plurality of contact holes 181, 184, and 186 exposing the end portions 129 of the gate lines 121, the second control electrodes 124b, and the secondary electrode lines 122, respectively.

A plurality of pixel electrodes 191, a plurality of first and second connecting members 85 and 86, and a plurality of contact assistants 81 and 82 are formed on the passivation layer 180. They may have a single-layer structure including an opaque conductor, or a double-layered structure including a transparent conductor layer such as ITO or IZO and an opaque conductor layer. The opaque conductor may include Al or an alloy thereof, or Au, Pt, Ni, Cu, or W having a large work function, or an alloy thereof.

The pixel electrodes 191 are physically and electrically connected to the second output electrodes 175b through the contact holes 185b.

The first connecting member 85 is connected to the second control electrode 124b and the first output electrode 175a through the contact holes 184 and 185a, respectively. The second connecting member 86 is connected to the secondary electrode line 122 through the contact hole 186.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and complement the adhesion between the end portions 129 and 179 and external devices.

A partition 361 is formed on the passivation layer 180. The partition 361 surrounds the pixel electrodes 191 and defines openings 365. The partition 361 may be made of one or more organic insulators, such as acrylic resin and polyimide resin having heat-resistant and dissolvent properties, or inorganic insulators such as silicon oxide ($SiO_2$) and titanium oxide ($TiO_2$), and may have a multilayered structure. The partition 361 may be made of a photosensitive material containing a black pigment so that the black partition 361 may serve as a light blocking member and the formation of the partition 361 may be simplified.

The partition 361 has a contact hole 186 exposing the second connecting member 86.

A plurality of light emitting members 370 are formed on the pixel electrodes 191 and confined in the openings 365 defined by the partition 361.

Each of the light emitting members 370 may have a multilayered structure including a light emitting layer (not shown) and auxiliary layers (not shown) for improving the efficiency of light emission by the emitting layer.

Each of the light emitting members 370 is preferably made of an organic material uniquely emitting light of a primary color such as red, green, and blue light. Alternatively, the light emitting members 370 is made of a mixture of an organic material and an inorganic material, and may include a high molecular substance such as polyfluorene derivative, (poly) paraphenylenevinylene derivative, polyphenylene derivative, polyfluorene derivative, polyvinylcarbazole, polythiophene derivative, or a compound doping the above high molecular substance with a perylene group pigment, a cumarine group pigment, a rhodamine group pigment, rubrene, perylene, 9,10-diphenylanthracene, tetraphenylbutadiene, Nile red, coumarin, quinacridone, etc. The OLED display displays images by selectively combining the monochromatic primary color lights emitted from the light emitting members 370.

Optionally, the auxiliary layers may include an electron transport layer (not shown) and a hole transport layer (not shown) for improving the balance of the electrons and holes and/or an electron injecting layer (not shown) and a hole injecting layer (not shown) for improving the injection of the electrons and holes. The hole transport layer and the hole injecting layer may be made of a material having a work function that lies between that of the pixel electrodes 191 and that of the emission layer, and the electron transport layer and the electron injecting layer may be made of a material having a work function that lies between that of a common electrode 270 and that of the emission layer. For example, the hole transport layer and the hole injecting layer may be made of a compound such as poly-(3,4-ethylenedioxythiophene): polystyrenesulfonate (PEDOT:PSS).

The common electrode 270 is formed on the light emitting members 370 and the partition 361. The common electrode 270 is formed on the whole of the substrate 110, and supplies currents to the light emitting members 370 in cooperation with the pixel electrodes 191.

The common electrode 270 is preferably made of transparent or translucent (semi-transparent) conductive materials having a good electron injection property and no influence on the organic material. For example, the common electrode 270 may include ITO, IZO, and may have a single-layer structure having a thickness of about 50 to 100 Å and including a little Al or Ag, or a multi-layer structure, such as Ca-Ag, LiF—Al, Ca—Ba, and Ca—Ag-ITO. As described above, the OLED display according to this embodiment, which includes the transparent or semi-transparent common electrode 270, emits light toward the top of the substrate 110, which is referred to as a top-emission OLED display.

The common electrode 270 is connected to the projection 123 of the secondary electrode line 122 through the contact hole 366 and the second connecting member 86. As described above, the OLED display according to this embodiment, which includes the common electrode 270 being connected to the secondary electrode line 122, may consistently supply a common voltage to the common electrode 270 even though the common electrode 270 is made of a transparent or semi-transparent material having a relatively large resistance, in order to emit light toward the top of the substrate 110. Accordingly, the common voltage may be uniformly supplied to the whole of the common electrode 270 without a voltage drop.

In the above-described OLED display, a first control electrode 124a connected to a gate line 121, a first input electrode 173a connected to a data line 171, and a first output electrode 175a along with a first semiconductor island 154a form a switching TFT Qs having a channel formed in the first semiconductor island 154a disposed between the first input electrode 173a and the first output electrode 175a. Likewise, a second control electrode 124b connected to a first output electrode 175a, a second input electrode 173b connected to a driving signal line 172, and a second output electrode 175b connected to a pixel electrode 191 along with a second semiconductor island 154b form a driving TFT Qd having a channel formed in the second semiconductor island 154b disposed between the second input electrode 173b and the second output electrode 175b.

The OLED display according to this embodiment is a top-emission OLED display that has a primary light exit surface at the top of the substrate 110, and therefore the aperture ratio may not relate to the disposition of the TFT and the wiring. Accordingly, the channel of the driving TFT Qd may be made relatively long by forming the channel portions into a wavelike shape as shown in FIG. 2, thereby increasing the driving current to enlarge luminance.

Although the OLED display according to this embodiment includes a plurality of pixels having one switching TFT Qs and one driving TFT Qd, additional TFTs and wiring for driving the pixels may be included to prevent degradation of the driving TFT Qd and shortening of the lifetime of the OLED display.

A pixel electrode 191, a light emitting member 370, and the common electrode 270 form an OLED LD having the pixel electrode 191 as an anode and the common electrode 270 as a cathode or vice versa. The overlapping portions of the storage electrode 127 and the driving signal line 172 form a storage capacitor Cst.

In the meantime, the semiconductor islands 154a and 154b, if made of polysilicon, may include intrinsic regions (not shown) disposed under the gate electrodes 124a and 124b and extrinsic regions (not shown) separated by the intrinsic regions. The extrinsic regions are electrically connected to the input electrodes 173a and 173b and the output electrodes 175a and 175b, and the ohmic contacts 163a, 163b, 165a, and 165b may be omitted.

The gate electrodes 124a and 124b may be disposed over the semiconductor islands 154a and 154b, while the gate insulating layer 140 is still interposed between the semiconductor islands 154a and 154b and the gate electrodes 124a and 124b. At this time, the data conductors 171, 172, 173b, and 175b may be disposed on the gate insulating layer 140 and electrically connected to the semiconductor islands 154a and 154b through the contact holes (not shown) in the gate insulating layer 140. Otherwise, the data conductors 171, 172, 173b and 175b may be disposed under the semiconductor islands 154a and 154b and may electrically contact the semiconductor islands 154a and 154b.

Sealing members 400 including a lower sealing member 410 and an upper sealing member 420 are formed on the common electrode 270. The sealing members 400 may encapsulate the light emitting members 370 and the common electrode 270 to prevent moisture and air entering the device.

The upper sealing member 420 is preferably made of an insulating material such as glass or plastic, and has a plate shape.

The lower sealing member 410 is disposed between the common electrode 270 and the upper sealing member 420 and may be a single layer or multiple layers. The lower sealing member 410 may be made of a thermosetting or photo-curable organic material such as urea resins, melamine resins, phenol resins, epoxy resins, saturated or unsaturated polyester resins, polyurethane resins, acrylic resins, vinyl acetate resins, ethylene-vinyl acetate copolymer resins, polyvinyl alcohol resins, polyamide resins, polyolefin resins, and cellulose.

The lower sealing member 410 may further include a hygroscopic material such as Ca, Ba, CaO or BaO to remove moisture.

Now, a method of manufacturing the OLED display shown in FIGS. 2-4 according to an embodiment of the present invention is described with reference to FIGS. 5-23 as well as FIGS. 2-4.

FIGS. 5, 8, 11, 18, and 21 are layout views of the OLED display shown in FIGS. 2-4 in intermediate steps of a manufacturing method thereof according to an embodiment of the present invention. FIGS. 6 and 7 are sectional views of the OLED display shown in FIG. 5 taken along the lines VI-VI and VII-VII, respectively, FIGS. 9 and 10 are sectional views of the OLED display shown in FIG. 8 taken along the lines IX-IX and X-X, respectively, and FIGS. 12 and 13 are sectional views of the OLED display shown in FIG. 11 taken along the lines XII-XII and XIII-XIII, respectively. FIGS. 14 to 17 are sectional views of the OLED display shown in FIG. 11 in intermediate manufacturing stages according to an embodiment of the present invention, FIGS. 19 and 20 are sectional views of the OLED display shown in FIG. 18 taken along the lines XIX-XIX and XX-XX, respectively, and FIGS. 22 and 23 are sectional views of the OLED display shown in FIG. 21 taken along the lines XXII-XXII and XXIII-XXIII, respectively.

Figure 5:
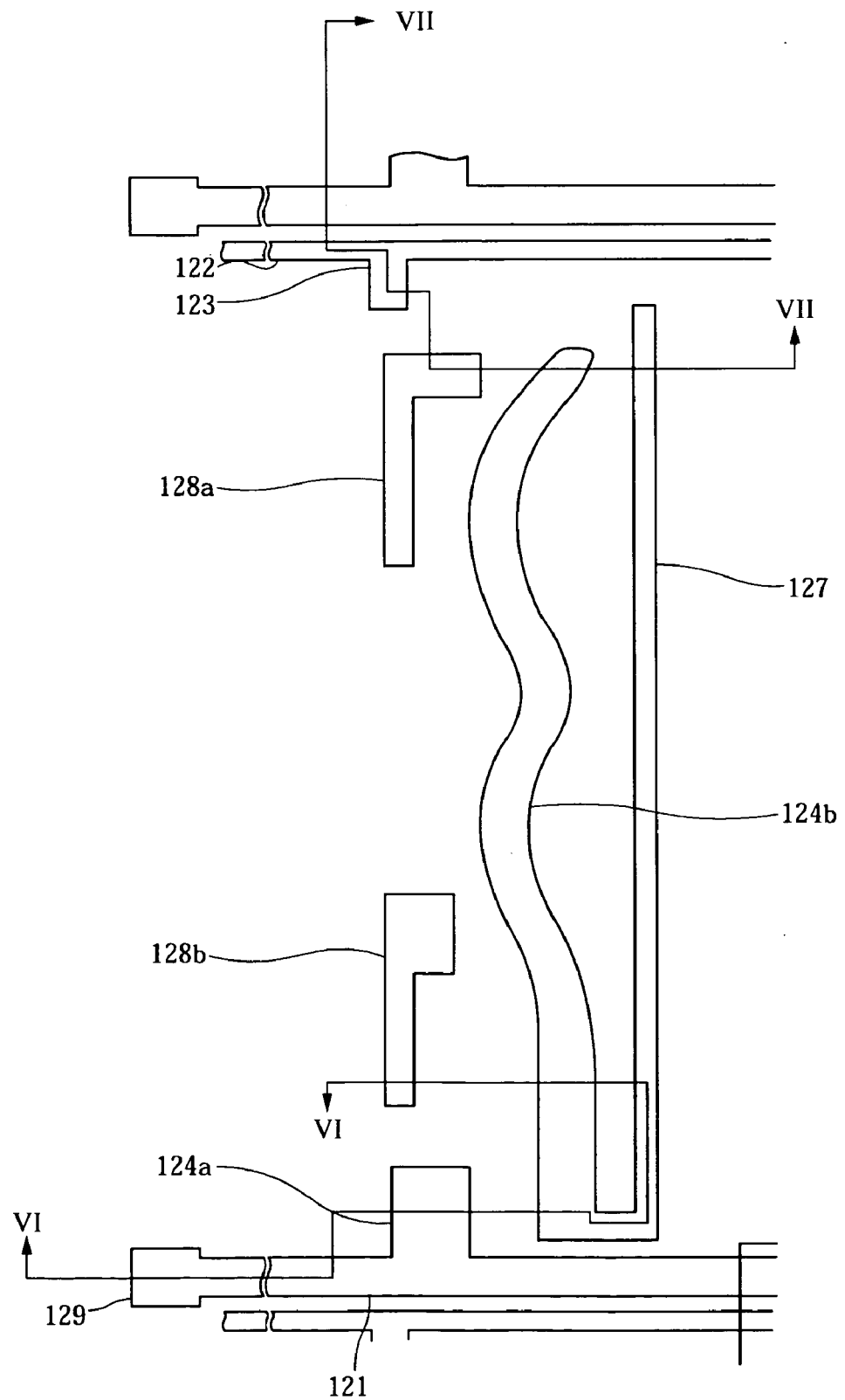
FIGS. 5, 8, 11, 18, and 21 are layout views of the OLED display shown in FIGS. 2-4 in intermediate steps of a manufacturing method thereof according to an embodiment of the present invention.
Figure 6:
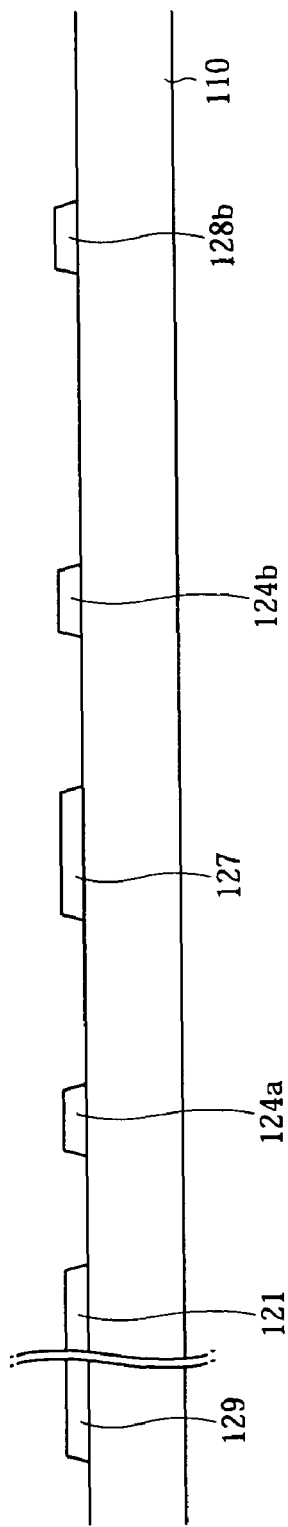
FIGS. 6 and 7 are sectional views of the OLED display shown in FIG. 5 taken along the lines VI-VI and VII-VII, respectively.
Figure 7:
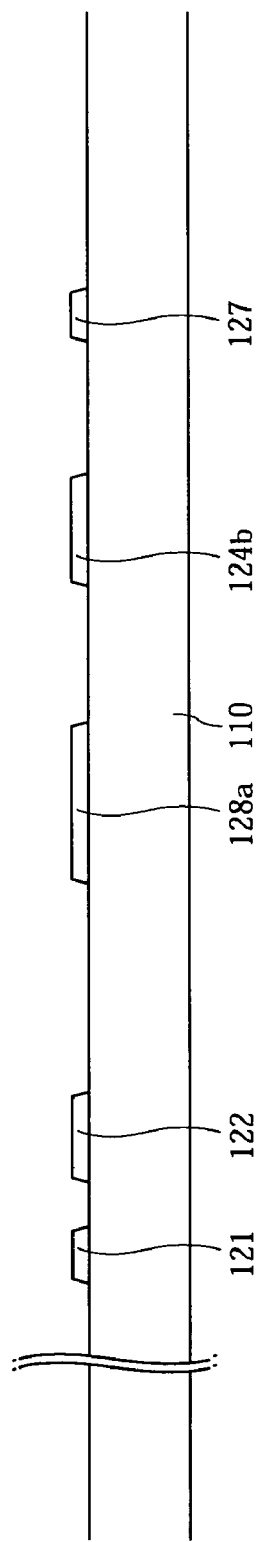

Referring to FIGS. 5 to 7, a conductive film preferably made of an Al alloy is deposited on an insulating substrate 110, such as transparent glass or plastic, and the conductive film is etched to form gate conductors. As described above, gate conductors include the gate lines 121 including the first control electrodes 124a and end portions 129, the second control electrodes 124b including storage electrodes 127, the secondary electrode lines 122 including projections 123, and the lower planarization members 128a and 128b.

Figure 8:
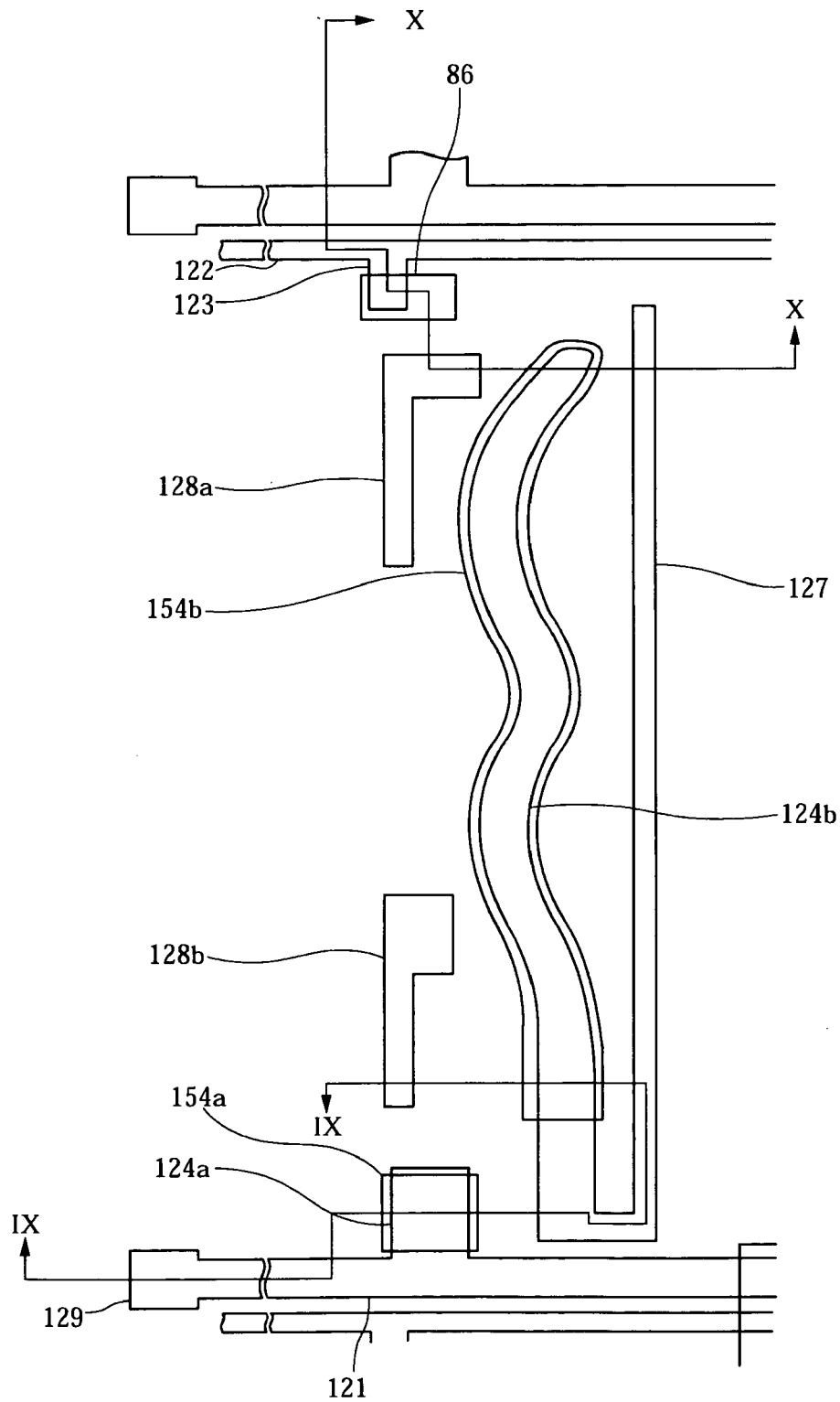
Figure 9:
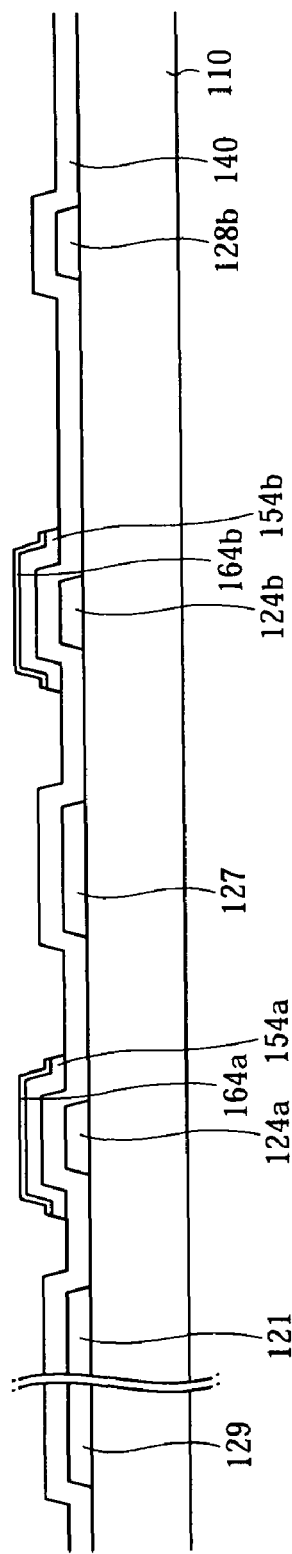
FIGS. 9 and 10 are sectional views of the OLED display shown in FIG. 8 taken along the lines IX-IX and X-X, respectively.
Figure 10:
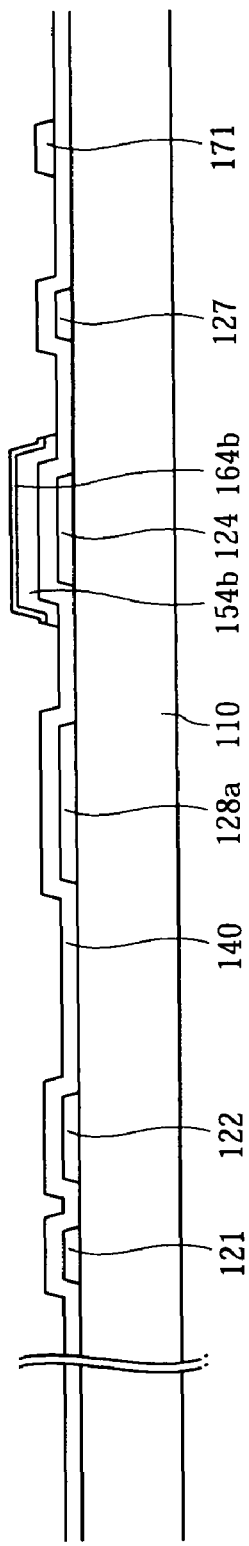

Referring to FIGS. 8 to 10, the gate insulating layer 140 is deposited, followed by the deposition of an intrinsic a-Si layer and an extrinsic a-Si layer on the gate insulating layer 140. The extrinsic a-Si layer and the intrinsic a-Si layer are patterned by photolithography and etching to form a plurality of extrinsic semiconductor stripes and islands 164a and 164b and a plurality of intrinsic semiconductor stripes and islands 151 and 154b.

Figure 11:
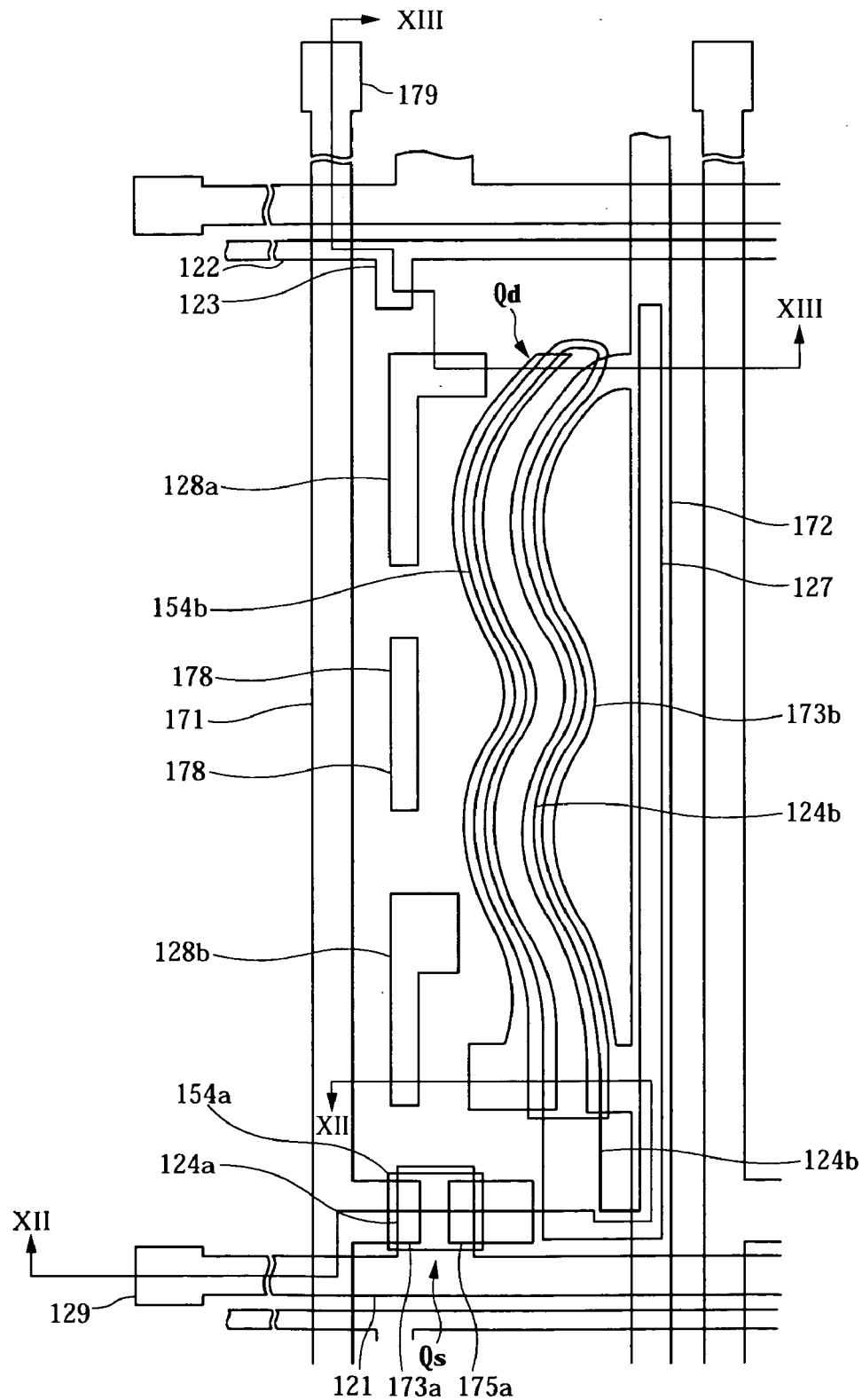
Figure 12:
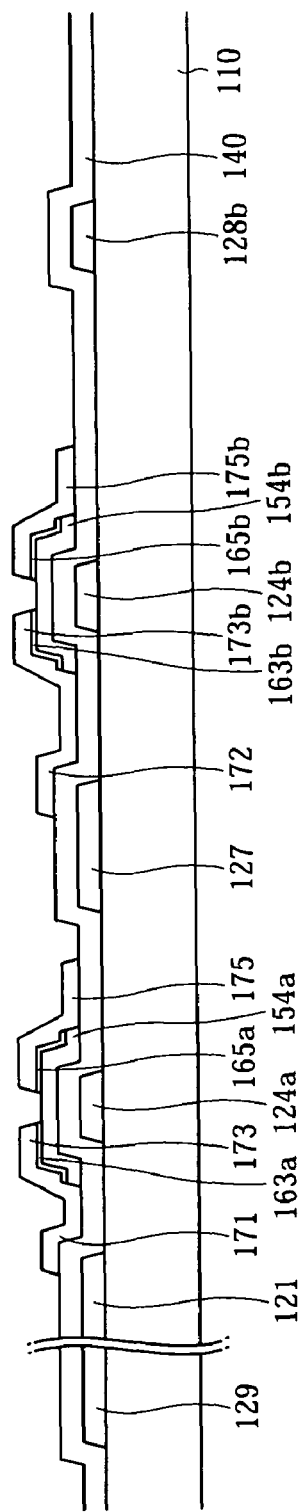
FIGS. 12 and 13 are sectional views of the OLED display shown in FIG. 11 taken along the lines XII-XII and XIII-XIII, respectively.
Figure 13:
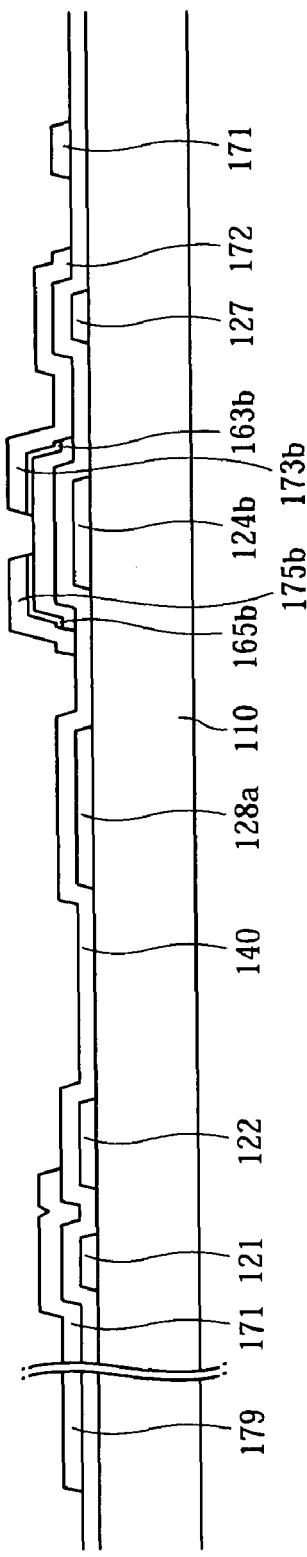

Referring to FIGS. 11 to 13, a conductive film preferably made of an Al alloy is deposited and patterned by photolithography and etching to form data conductors. As explained above, "data conductors" include the data lines 171 including first source electrodes 173a and end portions 179, the driving signal lines 172 including second source electrodes 173b, the first and second drain electrodes 175a and 175b, and the upper planarization members 178.

Thereafter, portions of the extrinsic semiconductors 164a and 164b that are not covered with the data conductors (171, 172, 175a, 175b, and 178) are removed by etching to complete a plurality of ohmic contacts 163a, 165a, 163b, and 165b and to expose portions of the underlying intrinsic semiconductors 154a and 154b.

Figure 14:
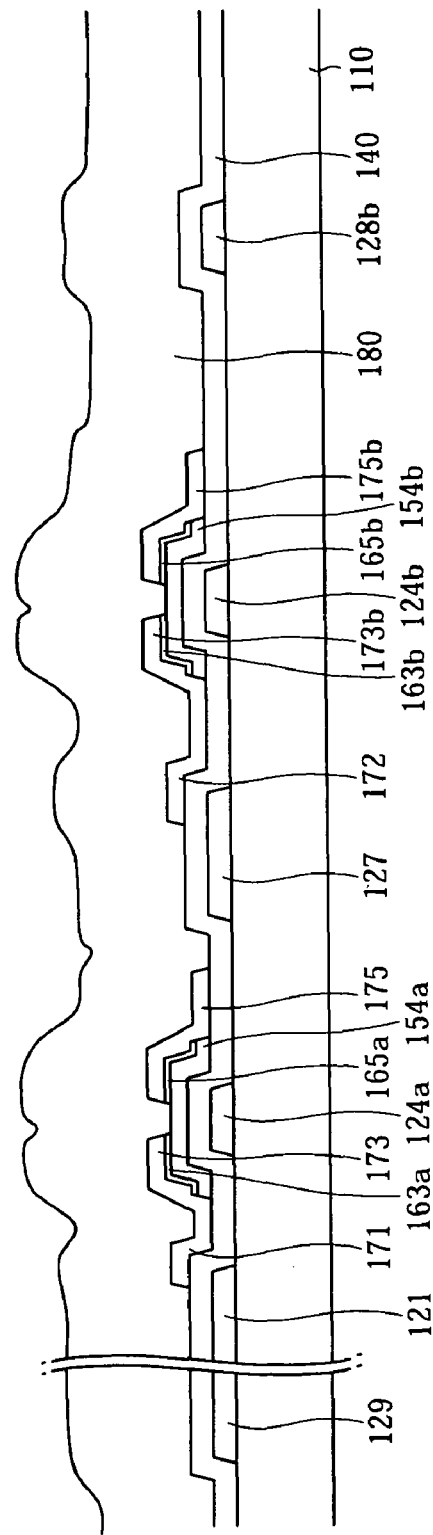
FIGS. 14 to 17 are sectional views of the OLED display shown in FIG. 11 in intermediate steps of a manufacturing method thereof according to an embodiment of the present invention.
Figure 15:
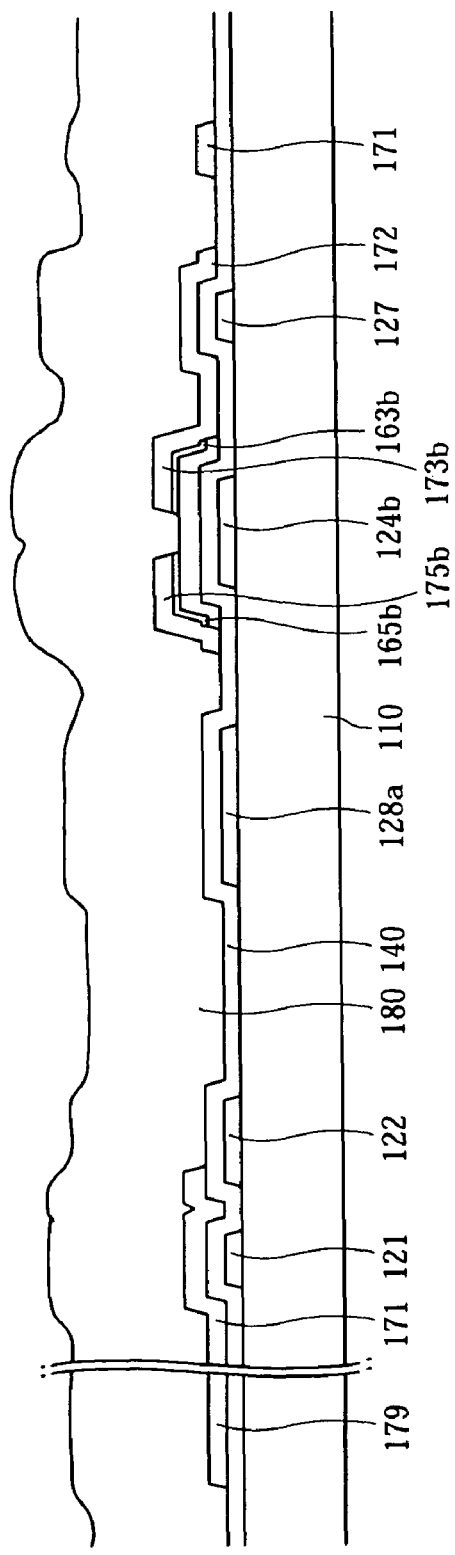
Figure 16:
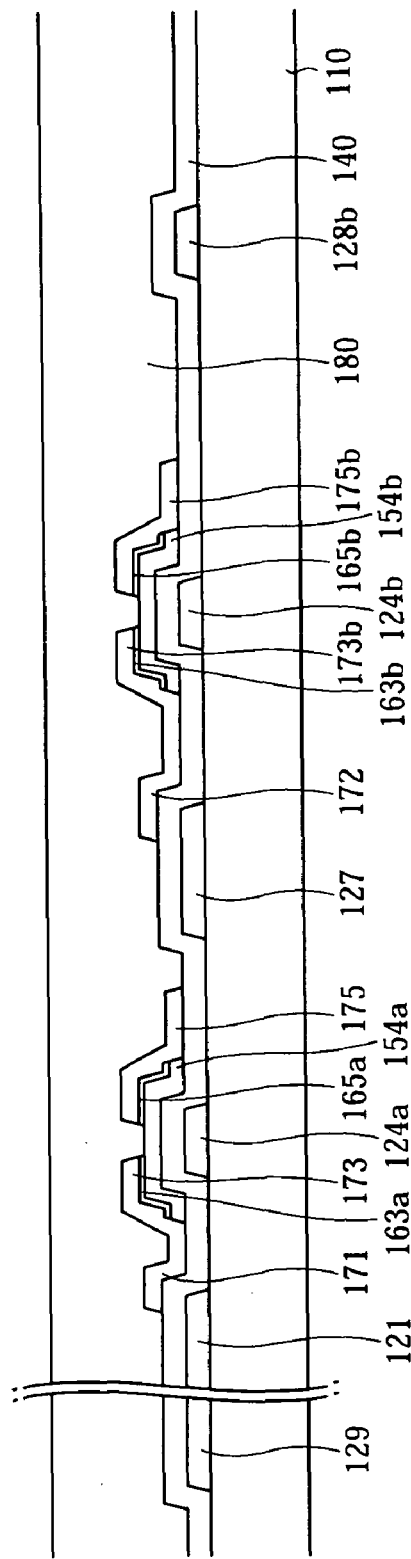
Figure 17:
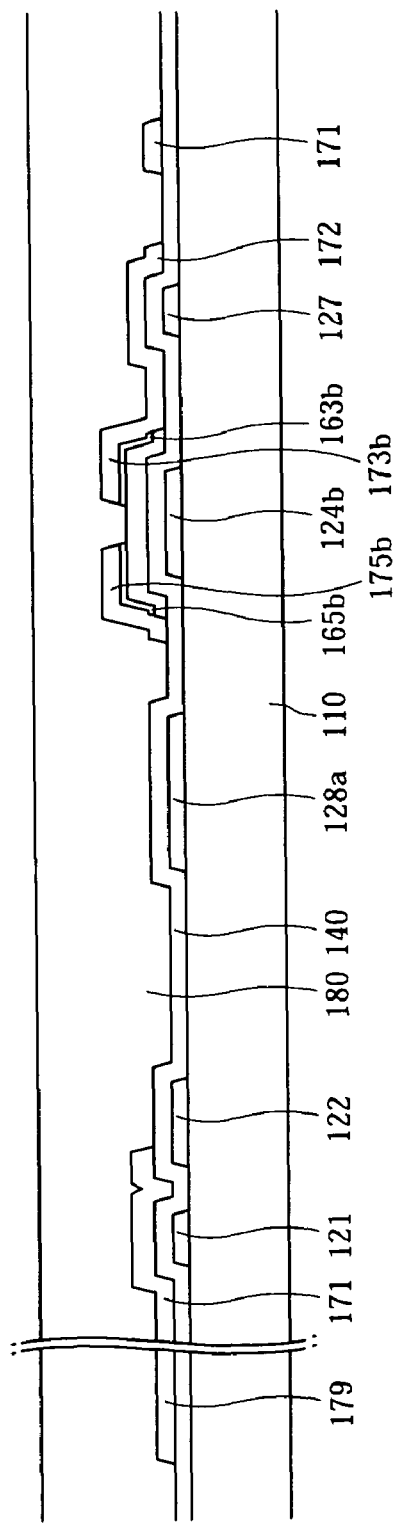

Referring to FIGS. 14 and 15, a passivation layer 180 is deposited by the chemical vapor deposition CVD method or by printing. Here, the surface of the passivation layer 180 is uneven due to the height difference in the underlying layers, such as the gate line, the data line, the thin film transistor, etc. After the uneven deposition, the surface of the passivation layer 180 is flattened by chemical mechanical polishing CMP.

Figure 18:
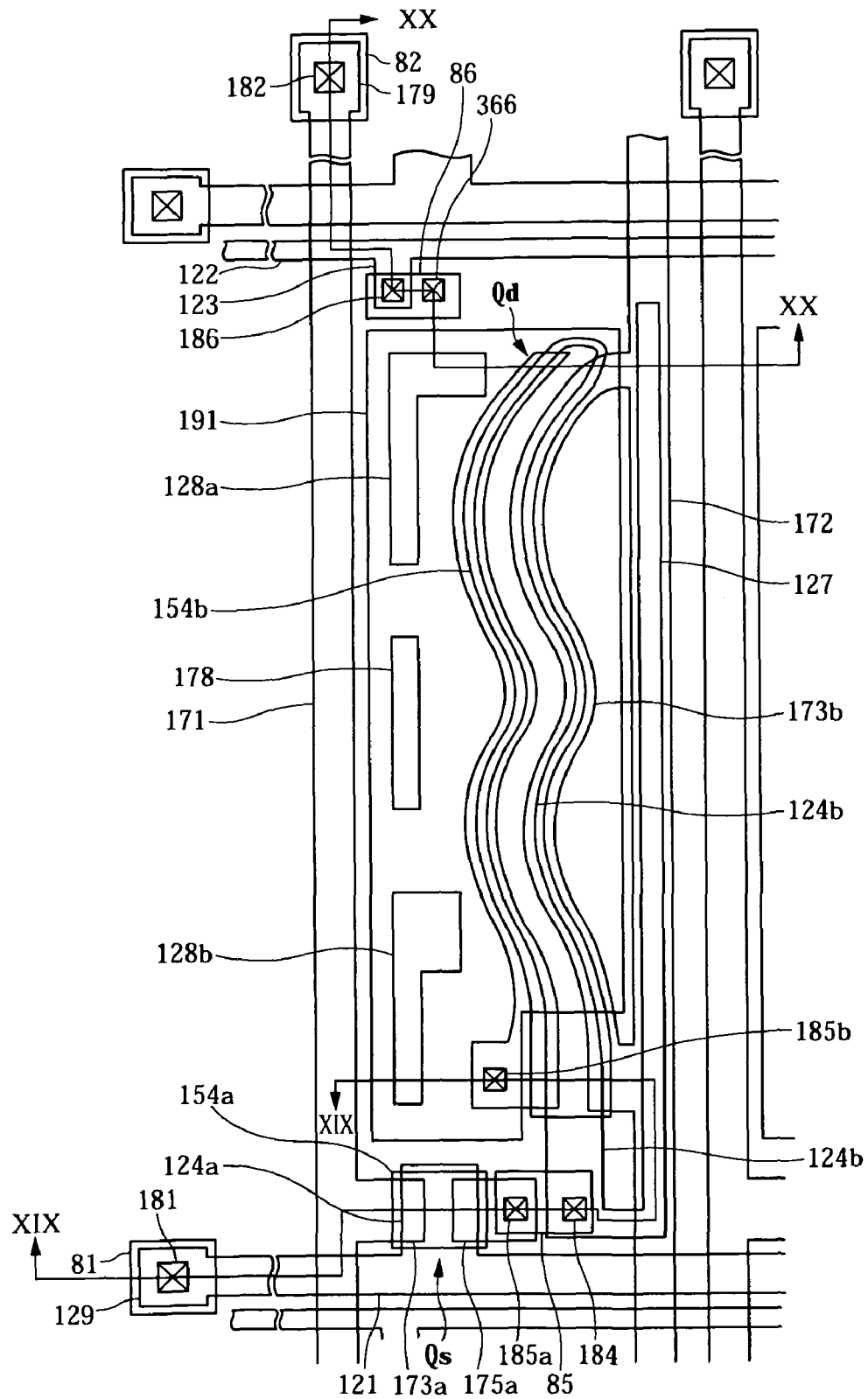
Figure 19:
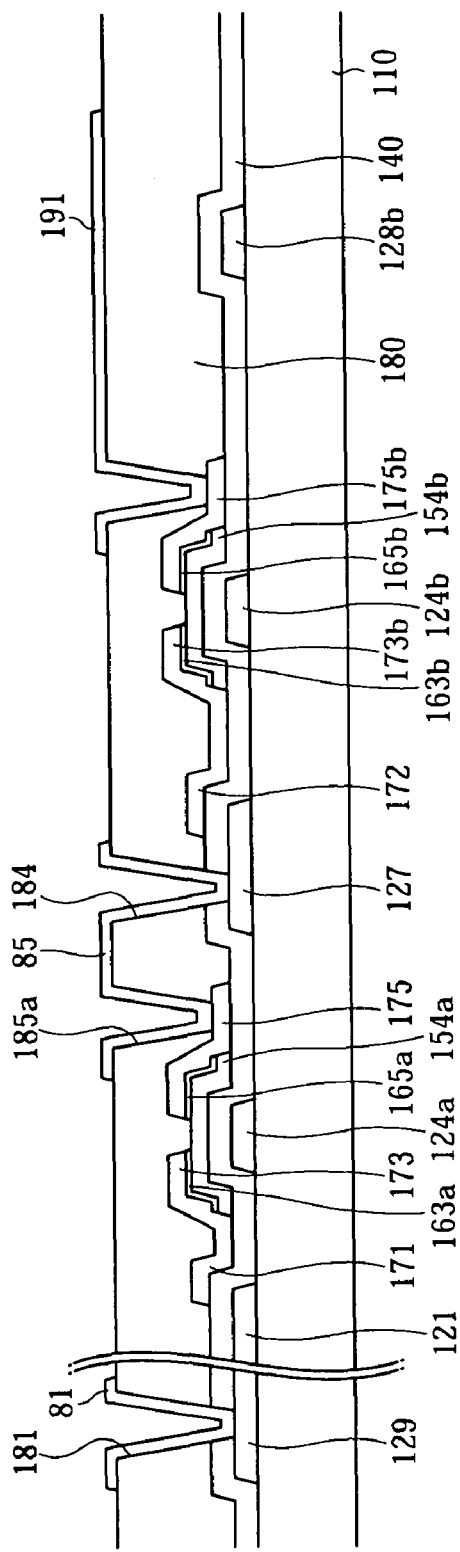
FIGS. 19 and 20 are sectional views of the OLED display shown in FIG. 18 taken along the lines XIX-XIX and XX-XX, respectively.
Figure 20:
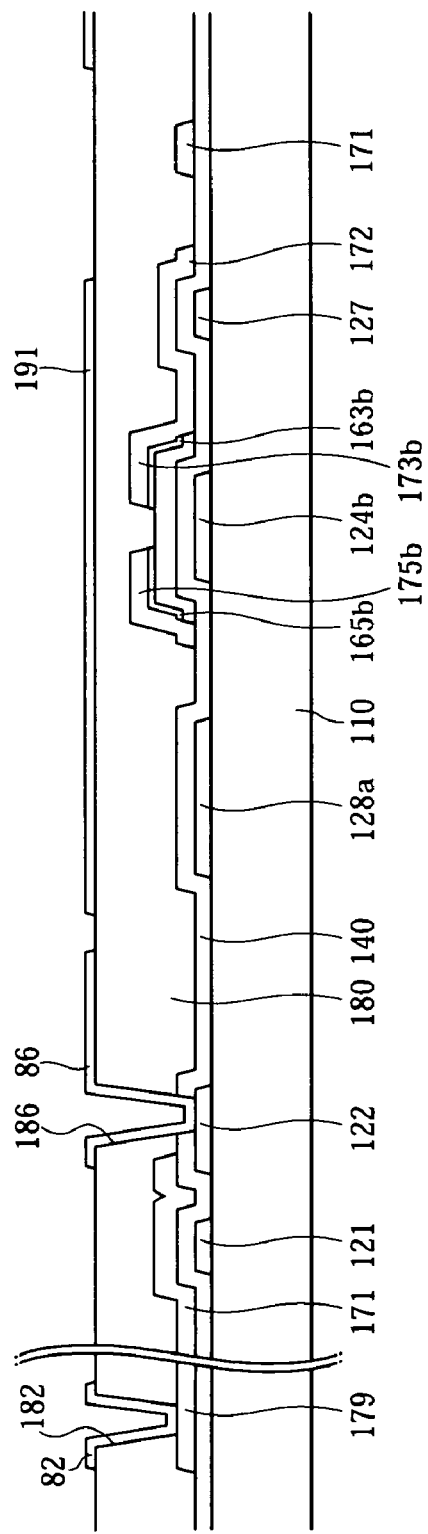

Referring to FIGS. 18 to 20, the flat passivation layer 180 is patterned by photolithography and etching to form a plurality of contact holes 181, 182, 184, 185a, 185b, and 186 exposing the end portions 129 of the gate lines 121, the end portions 179 of the data lines 171, the second control electrodes 124b, the first output electrodes 175a, the second output electrodes 175b, and the projections 123 of the secondary electrode lines 122, respectively.

Thereafter, a plurality of pixel electrodes 191, a plurality of first and second connecting members 85 and 86, and a plurality of contact assistants 81 and 82 are formed on the passivation layer 180.

Figure 21:
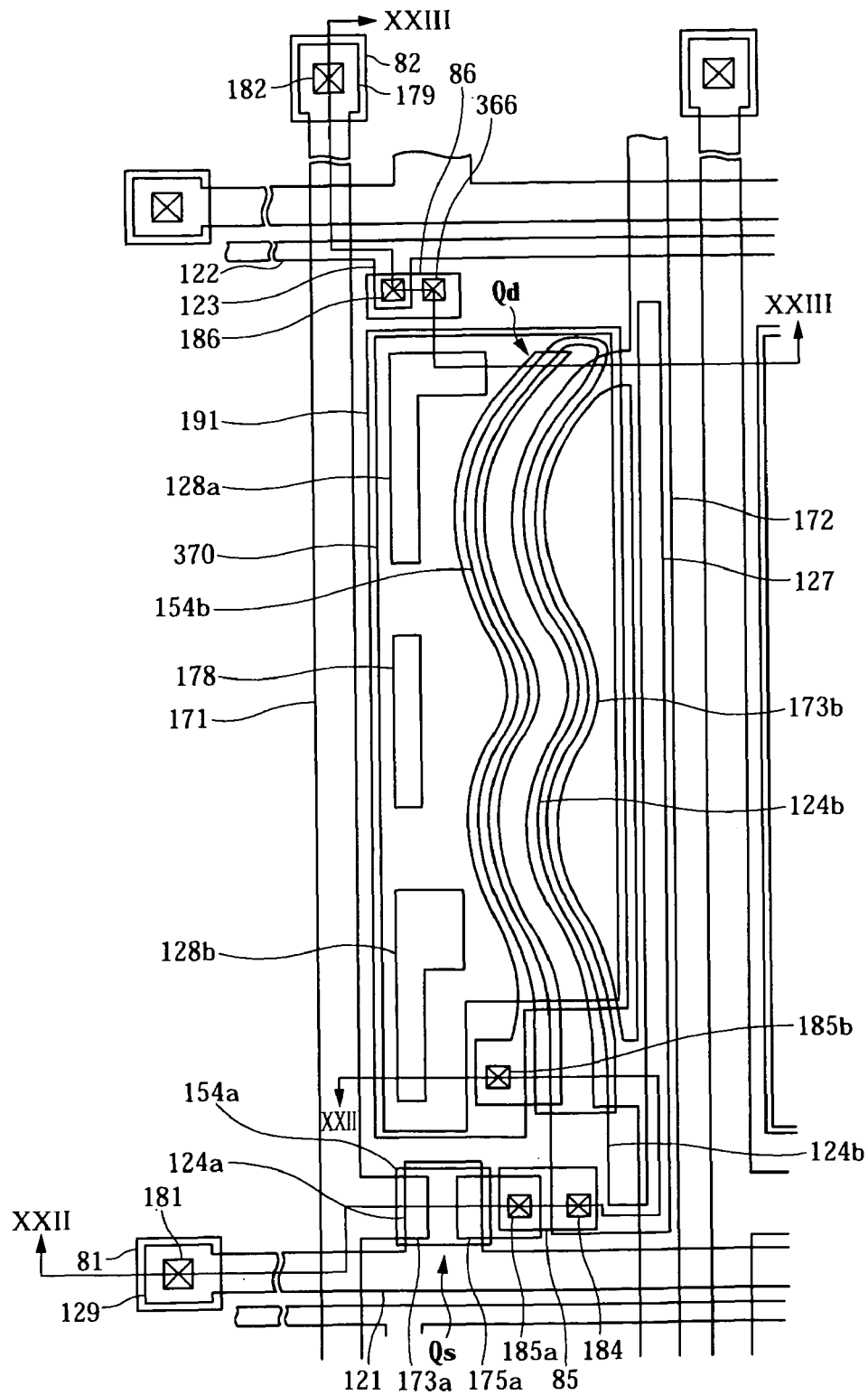
Figure 22:
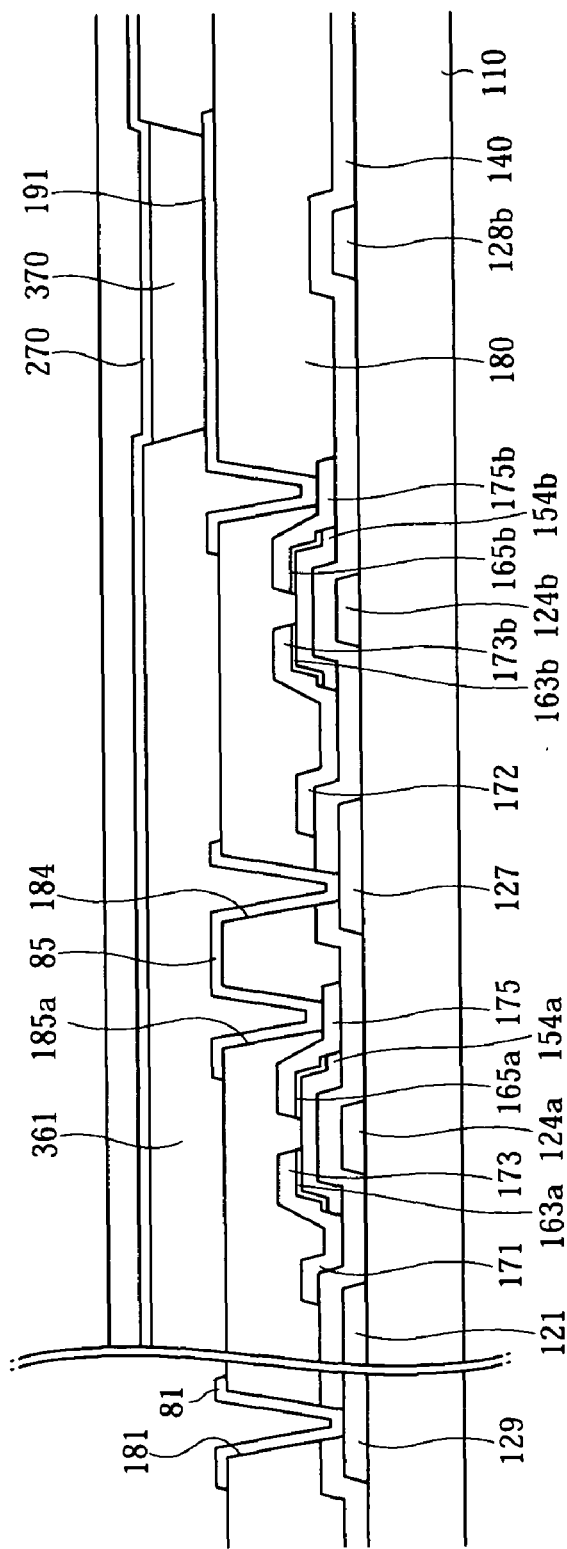
FIGS. 22 and 23 are sectional views of the OLED display shown in FIG. 21 taken along the lines XXII-XXII and XXIII-XXIII, respectively.
Figure 23:
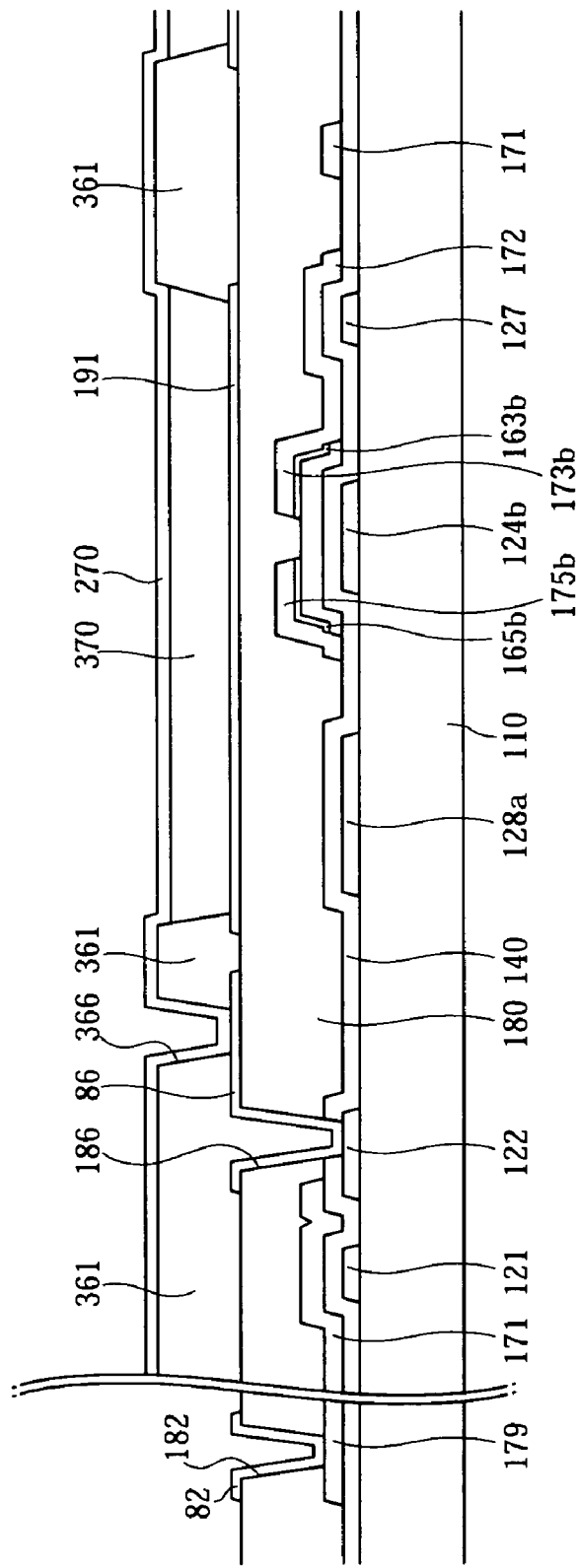

Referring to FIGS. 21 to 23, a photosensitive organic insulator is deposited by spin coating, exposed, and developed to form the partition film 361 having openings 365 and contact holes 366.

Thereafter, light emitting members 370 including a hole transport layer (not shown) and an emission layer (not shown) are formed in the openings 365 disposed on the pixel electrodes 191. The light emitting members 370 are preferably formed by a solution process, such as inkjet printing. During inkjet printing, a solution is dropped into the openings with a moving inkjet head (not shown), and in this case, a drying step for removing the solvent follows.

Thereafter, a common electrode 270 is formed on the partition film 361 and the light emitting members 370.

Sealing members 400 are formed on the common electrode 270 as shown in FIGS. 2 to 4.

The formation of the sealing members 400 is as follows.

A first blocking member including epoxy resins and calcium oxide is deposited on the common electrode 270 and a second blocking member including acryl resins is deposited on the first blocking member The first and second blocking members are joined together to form the lower sealing member 410 having a double-layered structure. The lower sealing member 410 is hardened and thus adhered to the common electrode 270.

Otherwise, a first blocking member is deposited on the common electrode 270 and half hardened, and then a second blocking member is deposited on the first blocking member to form the lower sealing member 410. Thereafter, the lower sealing member 410 is covered with the upper sealing member 420, which may be a glass plate, at a pressure below or above atmospheric pressure. Next, the lower sealing member 410 is hardened at atmospheric pressure. The lower sealing member 410 is treated in the different pressure conditions to prevent production of voids in the lower sealing member 410.

As described above, the OLED display according to this embodiment, which includes the driving TFT having channel portions with a wave-like shape, lower planarization members, and upper planarization members, may be supplied with increased driving current to enlarge luminance without decreasing the aperture ratio and can prevent the flat passivation layer from becoming uneven, thereby increasing the uniformity of the light emitting layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    a substrate;
    a first signal line formed on the substrate;
    a lower planarization member formed on the substrate;
    a first insulating layer formed on the first signal line and the lower planarization member;
    a second signal line formed on the first insulating layer and extending substantially perpendicular to the first signal line;
    an upper planarization member formed on the first insulating layer;
    a plurality of thin film transistors electrically coupled to the first signal line and the second signal line directly or indirectly;
    a second insulating layer formed on the second signal line and the upper planarization member;
    a first electrode formed on the second insulating layer and coupled to one of the thin film transistors, and overlapping the first and second planarization members;
    a light emitting member formed on the first electrode; and
    a second electrode formed on the light emitting members;
    wherein the lower planarization member is electrically insulated from the first signal line, the second signal line, and the thin film transistors, and does not overlap the first signal line, the second signal line, or the thin film transistors;
    wherein the upper planarization member is electrically insulated from the first signal line, the second signal line, and the thin film transistors, and does not overlap the first signal line, the second signal line, or the thin film transistors; and
    wherein the first signal line and the lower planarization member contact a surface of the substrate.

2. The OLED display of claim 1, wherein the first electrode comprises an opaque electrical conductor.

3. The OLED display of claim 1, wherein the second electrode comprises a transparent or translucent electrical conductor.

4. The OLED display of claim 1, further comprising a secondary electrode line formed on the same layer as the first signal line or the second signal line and coupled to the second electrode.

5. The OLED display of claim 1, wherein the surface of the second insulating layer has an uniform height.

6. The OLED display of claim 1, wherein the second insulating layer comprises an inorganic material.

7. The OLED display of claim 1, wherein the second insulating layer comprises an organic layer and an inorganic layer.

8. The OLED display of claim 1, wherein the first and second planarization members each have a linear shape or a plate shape.

9. The OLED display of claim 1, wherein the light emitting member comprises a soluble material.

10. The OLED display of claim 1, further comprising a partition surrounding the light emitting member.

11. The OLED display of claim 1, further comprising a sealing member formed on the second electrode, wherein the sealing member comprises: an insulating plate;
    and a blocking member disposed between the insulating plate and the second electrode.

12. The OLED display of claim 11, wherein the blocking member comprises at least one of a thermosetting material and a photo-curable material.

13. The OLED display of claim 11, wherein the blocking member comprises a moisture absorbent material.

* * * * *